(12) United States Patent
Collin et al.

(10) Patent No.: US 10,749,471 B2
(45) Date of Patent: Aug. 18, 2020

(54) AMPLIFICATION METHOD USING A MECHANICAL RESONATOR

(71) Applicant: CENTRE NATIONAL DE LA RECHERCHE SCIENTIFIQUE, Paris (FR)

(72) Inventors: Eddy Collin, Coublevie (FR); Martial Defoort, Grenoble (FR); Andrew Armour, Nottingham (GB)

(73) Assignee: CENTRE NATIONAL DE LA RECHERCHE SCIENTIFIQUE, Paris (FR)

( * ) Notice: Subject to any disclaimer, the term of this patent is extended or adjusted under 35 U.S.C. 154(b) by 106 days.

(21) Appl. No.: 16/066,473

(22) PCT Filed: Dec. 20, 2016

(86) PCT No.: PCT/EP2016/081853
§ 371 (c)(1),
(2) Date: Jun. 27, 2018

(87) PCT Pub. No.: WO2017/114689
PCT Pub. Date: Jul. 6, 2017

(65) Prior Publication Data
US 2019/0020308 A1    Jan. 17, 2019

(30) Foreign Application Priority Data

Dec. 28, 2015   (FR) ..................................... 15 63388

(51) Int. Cl.
*H03B 5/32*     (2006.01)
*G01N 5/02*     (2006.01)
(Continued)

(52) U.S. Cl.
CPC ................. *H03B 5/32* (2013.01); *G01G 3/16* (2013.01); *G01N 5/02* (2013.01); *G01N 9/002* (2013.01);
(Continued)

(58) Field of Classification Search
CPC . H03H 9/15; H03H 3/007; H03B 5/30; H03B 5/32; G01N 5/02; G01N 9/00; G01N 29/02; G01N 29/34; G01G 3/16
(Continued)

(56) References Cited

U.S. PATENT DOCUMENTS 9,383,208 B2 * 7/2016 Mohanty .............. G01C 21/165
2014/0312980 A1 10/2014 Villard et al.

OTHER PUBLICATIONS

French Search Report for Application No. 1563388, dated Sep. 19, 2016.
(Continued)

*Primary Examiner* — Arnold M Kinkead
(74) *Attorney, Agent, or Firm* — Young & Thompson

(57) ABSTRACT

An electromechanical amplifying method including a transducing an electrical signal to a mechanical resonator having a mechanical resonance mode with an angular frequency $\omega_0$; transducing the non-linear oscillations of the resonator into a transduced electrical signal; and filtering the transduced electrical signal to obtain an output signal, the signal transduced to the resonator being obtained by adding a first input signal of a first amplitude and a first angular frequency $\omega_s$ and a second pump signal of a second amplitude greater than the first amplitude and of a second angular frequency $\omega_s$ that is different from the first angular frequency, the first and second angular frequencies being close to the angular frequency $\omega_0$ of the mechanical resonator and the second pump signal being chosen from a range of angular frequencies $\omega_p$ and amplitudes in which the resonator is actuated in a non-linear regime.

20 Claims, 5 Drawing Sheets

(51) Int. Cl.
  *G01N 9/00* (2006.01)
  *H03H 7/46* (2006.01)
  *G01N 29/02* (2006.01)
  *G01G 3/16* (2006.01)
  *G01N 29/34* (2006.01)
  *H03H 3/007* (2006.01)
  *H03H 9/15* (2006.01)

(52) U.S. Cl.
  CPC ......... *G01N 29/022* (2013.01); *G01N 29/346* (2013.01); *H03H 3/0076* (2013.01); *H03H 7/46* (2013.01); *H03H 9/15* (2013.01)

(58) Field of Classification Search
  USPC ............ 310/306, 324, 312, 317; 331/116 M, 331/154; 333/219
  See application file for complete search history.

(56) References Cited

OTHER PUBLICATIONS

International Search Report for Application No. PCT/EP2016/081853, dated Mar. 16, 2017.

Cleland et al., "External control of dissipation in a nanometer-scale radiofrequency mechanical resonator," Sensors and Actutators 72 (1999), pp. 256-261.

Collin et al., "In-situ comprehensive calibration of a tri-port nano-electro-mechanical device," Review of Scientific Instruments, 83, 045005, Apr. 30, 2012.

Defoort et al., "Modal 'self-coupling' as a sensitive probe for nanomechanical detection," Nov. 23, 2015, retrieved from the Internet: URL: https://arvix.org/pdf/1511.07273.pdf.

Defoort et al., "Scaling laws for the bifurcation escape rate in a nanomechanical resonator," Physical Review E (Statistical, Nonlinear and Soft Matter Physics, vol. 92, No. 5, Nov. 23, 2015.

Kacem et al., "Nonlinear dynamics of nanomechanical beam resonators: improving the performance of NEMS-based sensors," Nanotechnology, Institute of Physics, 2010, 20 (27).

Lulla et al., "Nonlinear modal coupling in a high-stress doubly-clamped nanomechanical resonator," New Journal of Physics 14, 2012, Nov. 28, 2012.

Postman et al., "Dynamic range of nanotube- and nanowire-based electromechanical systems," Applied Physics Letters, 86, 223105, 2005.

\* cited by examiner

AMPLIFICATION METHOD USING A MECHANICAL RESONATOR

TECHNICAL FIELD OF THE INVENTION

The present invention relates to an electromechanical amplifier and an electromechanical amplifying method capable of maintaining the linearity of the amplification.

BACKGROUND OF THE INVENTION

Micro- and nanoelectromechanical systems (MEMS and NEMS, respectively) allow for the detection of chemical or biological compounds at extremely low detection thresholds, e.g. on the order of the attogram, when they are used as resonators. When an oscillating micro- or nanosystem interacts with a chemical or biological compound, the mechanical characteristics of the resonator may vary: measurement of a variation in the amplitude of the oscillator or of the variation in a frequency of a mode of the oscillator can make it possible to detect the compound or compounds.

Resonators of the MEMS and NEMS types have a higher aspect ratio than that of macroscopic resonators. An increase in the aspect ratio of a mechanical resonator favours the appearance of non-linear phenomena during the oscillation of the resonator (Postma, H. C., Kozinsky, I., Husain, A., & Roukes, M. L. (2005). Dynamic range of nanotube- and nanowire-based electromechanical systems. Applied Physics Letters, 86(22), 223105). Thus, for a wide range of amplitudes, a resonator at the micrometre or nanometre scale displays so-called "Duffing" behaviour, i.e. behaviour described by the following equation:

$$\ddot{x} + \Delta\omega\dot{x} + \omega_0^2 x + \gamma x^3 = \frac{F_L}{m} \quad (1)$$

where x is the amplitude of the measured signal, $\omega_0$ is the pulse resonance, $\Delta\omega$ is the dissipation related to the resonator's movement, $F_L$ is the force transduced to the resonator, m is the mass of the resonator, and $\gamma$ is the non-linear coefficient, known as the "Duffing coefficient". A person skilled in the art will find the known equation for a harmonic oscillator having a resonance that follows a Lorentzian curve, when the coefficient $\gamma=0$.

The non-linearity in an oscillator's behaviour leads to problems in implementing a detection function: an electromechanical transducer is typically a MEMS or NEMS oscillator able to operate in the linear regime. Otherwise, a mechanical bistability or hysteresis during an oscillation may compromise the transmission of a stimulus that is to be detected. Indeed, if the oscillation amplitude is not too large, a Duffing-type non-linearity (which obeys the Duffing equation) deforms the resonance and gives rise to a form of resonance known as Duffing-type resonance. If the oscillation amplitude is very large, the system enters a bistable regime which, in most applications, drastically compromises the transmission of a stimulus that is to be detected.

One solution to avoid non-linearities in the oscillations of the resonator may consist in exciting the resonator with forces that are weak enough to stay within the linear regime. In practice, the amplitude of the oscillations measured during resonance is often too weak to discriminate a signal from the measurement noise or to measure variations quantitatively.

Another solution consists in exciting a resonator with forces that can induce an amplitude large enough to be detected, but thereby also inducing non-linear behaviour, which must be corrected. A grid coupled to the resonator by electrical polarisation is used to compensate the non-linearities in the dynamics of the resonator (Kacem, N., Hentz, S., Pinto, D., Reig, B., & Nguyen, V. (2009). Non-linear dynamics of nanomechanical beam resonators: improving the performance of NEMS-based sensors. Nanotechnology, 20(27), 275501). When implementing this solution, numerical simulations that are costly in terms of calculations and time are necessary to find the appropriate experimental parameters for compensating non-linearities. In addition, the implementation of one or more grids must be tolerated by the resonator's mode of operation.

The present invention aims to overcome the aforementioned disadvantages of the prior art and, in particular, it aims to actuate the resonator in a given range of frequencies, close to its resonance frequency, proportionally to an excitation force, in the widest possible amplitude range and particularly in an amplitude range in which the resonator typically oscillates according to the so-called Duffing equation detailed above, while preserving its linearity, so that its mechanical resonance in this frequency range follows a Lorentzian curve and so that the detected signal is proportional to the injected signal.

SUMMARY OF THE INVENTION

One purpose of the invention making it possible to achieve this aim is an electromechanical amplifying method comprising at least:

a first transducing step consisting in transducing an electrical signal to a mechanical resonator having a mechanical resonance mode with an angular frequency $\omega_0$, said electrical signal actuating non-linear oscillations of the resonator;

a second transducing step consisting in transducing the non-linear oscillations of the resonator into a transduced electrical signal; and a filtering step consisting in filtering said transduced electrical signal to obtain an output signal;

the method is characterised in that:

the signal transduced to the resonator is obtained by adding a first input signal of a first amplitude and of a first angular frequency $\omega_s$ and a second pump signal of a second amplitude greater than the first amplitude and of a second angular frequency $\omega_p$ that is different from the first angular frequency, the first and second angular frequencies being close to the angular frequency $\omega_0$ of the mechanical resonator and the second pump signal being chosen from a range of angular frequencies $\omega_p$ and amplitudes in which the resonator is actuated in a non-linear regime; and in that the output signal is amplified, the amplitude of the oscillations measured after the filtering varying linearly with the first input signal of angular frequency $\omega_s$, and the resonant mode obtained is that of a linear resonance.

an electromechanical amplification device, which includes at least one mechanical resonator having a mechanical resonance mode of angular frequency $\omega_0$ and which also comprises:

an electrical signal adder, able to add a first input signal of a first amplitude and of a first angular frequency $\omega_s$ and a second pump signal of a second amplitude greater than the first amplitude and of a second angular frequency $\omega_p$ that is different from the first angular frequency, the first and second angular frequencies being close to the angular frequency $\omega_0$ of the mechanical resonator, the second pump signal being chosen from a range of angular frequencies $\omega_p$ and amplitudes in which the resonator is actuated in a non-linear regime;

a first electromechanical transducer connected on one hand electrically to the output of the adder (5) and on the other hand mechanically to the mechanical resonator (1), the first transducer being adapted to transduce the electrical signal at the output of the adder to the mechanical resonator in order to actuate non-linear oscillations of the resonator;

a second electromechanical transducer connected on one hand mechanically to the mechanical resonator (1) and on the other hand electrically to a filter (4), the second transducer being adapted to transduce the non-linear oscillations of the resonator into a transduced electrical signal; and an electrical signal filter (4) able to filter the transduced electrical signal to obtain an output signal (6), the output signal being amplified, the amplitude of the oscillations measured at the output of the filter varying linearly with the first input signal of angular frequency $\omega_s$ and the resonant mode obtained is that of a linear resonance.

Advantageously, the mechanical resonator is chosen at least between a microsystem and a nanosystem and the bandwidth of the filter is chosen such that the signal at the output of the filter has an amplitude that is linearly dependent on the input signal.

Advantageously, the bandwidth of the filter of the electromechanical amplifier is centered on an angular frequency substantially close to $\omega_s$.

Advantageously, the non-linear oscillation regime of the electromechanical amplifier is a Duffing regime.

Advantageously, at least two elements chosen among the adder, the filter, the first mechanical transducer and the second electromechanical transducer are monolithically integrated.

Advantageously, the electromechanical amplifier includes an electrical generator of the pump signal.

Advantageously, the electromechanical amplifier comprises a magnetic field generator generating a homogeneous magnetic field substantially perpendicular to the major axis of the mechanical resonator and in which at least one transducer chosen between the first transducer and the second transducer is adapted to transduce energy by means of the work done by Laplace forces or Lorentz forces.

Advantageously, the electromechanical amplifier comprises at least one transducer chosen between the first transducer and the second transducer adapted to transduce energy by means of an effect chosen among at least one piezoelectric and piezoresistive effect.

Another purpose of the invention is a method for actuating a mechanical resonator having at least one mechanical resonance mode of angular frequency $\omega_0$, the method comprising at least the steps consisting in:

adding a first input signal, of angular frequency $\omega_s$, close to and different from $\omega_0$, and a second pump signal, of angular frequency $\omega_p$, close to and different from $\omega_0$ and different from $\omega_s$;

transducing the signal resulting from the first step of the method to the mechanical resonator with an amplitude sufficient to actuate the resonator in a non-linear regime in a first range of angular frequencies close to $\omega_0$;

whereby the amplitude of the oscillations of the mechanical resonator varies linearly with the input signal in a second range of angular frequencies close to $\omega_s$.

Advantageously, the difference $\delta_s$ defined by $\omega_s-\omega_p$ in the method is at least fifty times smaller than $\omega_0$, the difference $\delta_p$ defined by $\omega_p-\omega_0$ is at least fifty times smaller than $\omega_0$ and $\omega_p$ is different from $\omega_s$.

Another purpose of the invention is a method for amplifying a first input signal of angular frequency $\omega_s$ close to and different from $\omega_0$ by a mechanical resonator having at least one mechanical resonance mode of angular frequency $\omega_0$, the method including at least the steps consisting in:

adding the input signal to a second pump signal of angular frequency $\omega_p$ close to and different from $\omega_0$ and different from $\omega_s$;

transducing the signal resulting from the first step of the method to the mechanical resonator with an amplitude sufficient to actuate the resonator in a non-linear regime in a first range of angular frequencies close to $\omega_0$;

measuring at least one amplitude of the oscillation, called the output amplitude, of the mechanical resonator in a second range of angular frequencies close to $\omega_p$;

whereby the amplitude of the oscillations of the mechanical resonator varies linearly with the input signal in a second range of angular frequencies close to $\omega_p$.

Advantageously, the non-linear regime of the second step of the method is a Duffing regime.

Advantageously, a number of amplitudes of the oscillation are measured in the third step of the method and the shape of the curve of these amplitudes of oscillation as a function of the angular frequencies of the second range is Lorentzian.

Advantageously, the difference $\delta_s$ defined by $\omega_s-\omega_p$ is at least fifty times smaller than $\omega_0$, the difference $\delta_p$ defined by $\omega_p-\omega_0$ is at least fifty times smaller than $\omega_0$ and $\omega_p$ is different from $\omega_s$.

Advantageously, in the method, the output amplitude of the mechanical transducer is measured substantially at the angular frequency $\omega_p+\delta_s$.

Advantageously, the method is implemented by an electromechanical amplifier.

Advantageously, the transduction of the signal resulting from the first step of the method to the mechanical resonator is adapted to induce oscillations of the mechanical resonator according to a non-linear differential equation.

Advantageously, the transduction of the signal resulting from the first step of the method to the mechanical resonator is adapted to induce oscillations of the mechanical resonator according to a non-linear differential equation in which the Duffing coefficient is non-zero.

Advantageously, the angular frequency $\omega_p$ of the pump signal is strictly greater than the angular frequency $\omega_0$.

Advantageously, the angular frequency $\omega_s$ of the input signal is strictly greater than the angular frequency $\omega_p$ of the pump signal.

Advantageously, the method includes a step consisting in filtering the signal of the output amplitude with a bandpass filter having a high quality factor, the bandwidth of which is centered on an angular frequency close to $\omega_0$ and preferentially centered on an angular frequency of substantially $\omega_p+\delta_s$.

DESCRIPTION OF THE FIGURES

The following description presents several example embodiments of the device of the invention: these examples do not limit the scope of the invention. These example embodiments have both the essential characteristics of the invention and additional characteristics associated with the embodiments considered. For the sake of clarity, the same elements bear the same references in the various figures.

The invention will be better understood and other advantages, details and characteristics thereof will emerge during the explanatory description that follows, given by way of example with reference to the annexed drawings wherein.

DETAILED DESCRIPTION OF THE INVENTION

Figure 1:
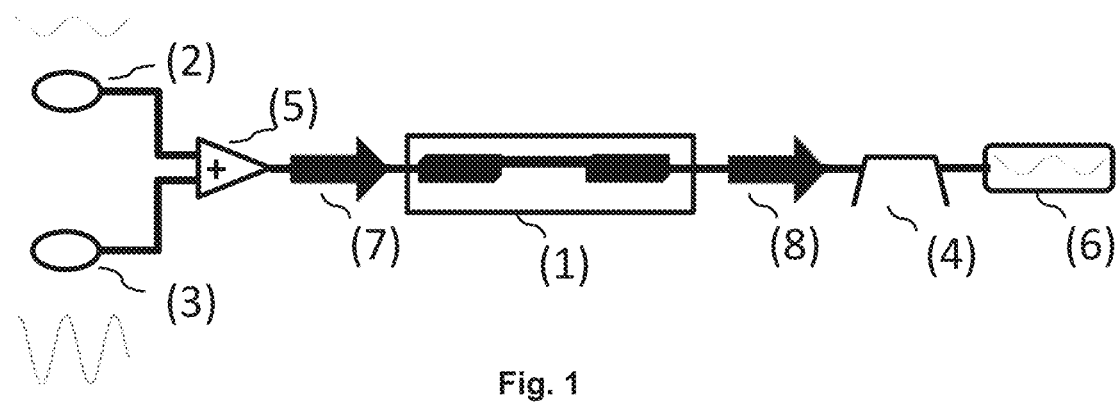
FIG. 1 illustrates a linear electromechanical amplifier according to one embodiment of the invention.

FIG. 1 illustrates an electromechanical amplifier according to one embodiment of the invention. The amplifier includes a mechanical resonator 1, having at least one mechanical resonance mode of angular frequency $\omega_0$. The amplifier includes an adder 5, able to add two electrical signals. A first input signal 2 is characterised by an angular frequency $\omega_s$, close to $\omega_0$. A second pump signal 3 is characterised by an angular frequency $\omega_p$, close to $\omega_0$ and different from $\omega_s$ $$\left( \frac{\omega_p^2 - \omega_0^2}{2\omega_p} \approx \delta_p, \frac{\omega_s^2 - \omega_0^2}{2\omega_s} \approx \delta_p, \frac{\beta}{\omega_p} \approx \frac{\beta}{\omega_s} \approx \frac{\beta}{\omega_0} \text{ with } \beta = \frac{3\gamma}{8\omega_0} \right).$$

The amplifier also includes a filter 4, able to filter electrical signals with a high quality factor. In one embodiment of the invention, a bandpass filter is used. The bandwidth of filter 4 is centered on a frequency close to $\omega_0$. In one embodiment of the invention, the bandpass filter allows for selective transmission of signals in a range of angular frequencies centered on $\omega_s$ without transmitting the signals in a range of angular frequencies centered on $\omega_0$ and/or $\omega_p$. In some embodiments of the invention, the quality factor of the filter is preferentially greater than or equal to $\omega_0/(\omega_p-\omega_s)$. In one embodiment of the invention, the bandpass filter used is a synchronous detection. The bandwidth of filter 4 is chosen such that the signal at the output of filter 4 has an amplitude that is linearly dependent on input signal 2. This characteristic is explained later in the description.

The amplifier also includes a first electromechanical transduction system (7) connected electrically to the output of adder 5 and mechanically to mechanical resonator 1. It also includes a second transduction system (8) connected mechanically to resonator 1 and to filter 4. The first and second transduction systems are typically implemented in MEMS or NEMS. In the embodiments, they can be implemented by piezoelectric, piezoresistive, capacitive and/or magnetomotive systems.

Figure 2:
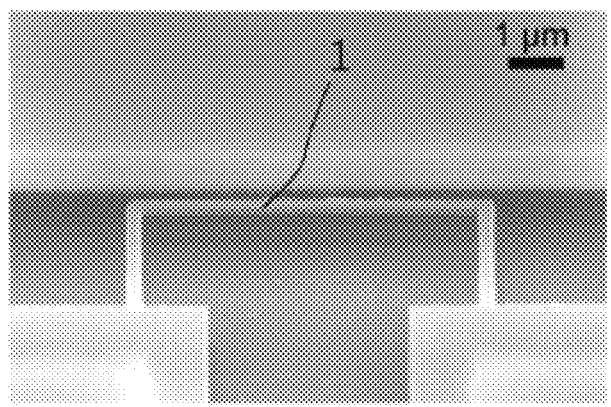
FIG. 2 is a set of photographs obtained by means of an electron microscope illustrating resonators according to several embodiments of the invention.
Figure 2:
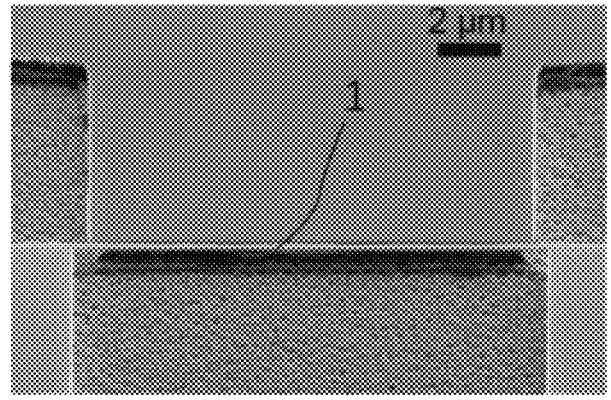

FIG. 2 is a set of photographs obtained by means of an electron microscope illustrating resonators 1 according to several embodiments of the invention. In particular embodiments of the invention, the resonator can be a microsystem and/or a nanosystem. A microsystem is a system whereof the smallest characteristic dimension is included in a range from 1 µm to 1000 µm inclusive. A nanosystem is a system whereof the smallest characteristic dimension is included in a range from 1 nm to 1000 nm inclusive.

Panel A of FIG. 2 is a photograph of a NEMS-type resonator having a gate or arch shape. The central part measures 7 µm in length, its side parts measure 3 µm in length. It includes a layer of silicon 150 nm thick on which is deposited a layer of aluminium 30 nm thick. Panel B of FIG. 2 is a photograph of a NEMS-type resonator having a doubly-clamped bar shape. The resonator measures 15 µm in length. It includes a layer of silicon nitride 100 nm thick on which is deposited a layer of aluminium 30 nm thick. In one embodiment of the invention, not represented, the chosen mechanical resonator 1 can be a membrane.

In a preferred embodiment of the invention multiple elements chosen from among resonator 1, filter 4, the first transducer, the second transducer or the adder are monolithic or integrated, i.e. manufactured from the same substrate, e.g. a silicon substrate.

In one embodiment of the invention, the resonator is placed in a very low-temperature cooled enclosure. A first enclosure can be filled with liquid nitrogen. A second enclosure, positioned inside the first enclosure, can contain liquid helium and condition the temperature of the resonator to 4.2 Kelvin.

A vacuum can also be created inside of a cell containing resonator 1. A partial vacuum can be created by means of a pump to achieve a pressure of $10^{-4}$ mbar. By cooling the cell as described above, the gas remaining in the cell can be adsorbed to the walls, allowing for a higher vacuum (by cryopumping): the pressure of the enclosure can be $10^{-6}$ mbar.

In one embodiment of the invention, the electromechanical amplifier includes an electric generator adapted to generate a pump signal 3. The generator used in one embodiment of the invention is the Tektronix AFG 3252 and can achieve a frequency of 240 MHz.

In one embodiment of the invention, the amplifier includes a homogeneous magnetic field generator. This generator can be a coil, surrounding one of the enclosures described above. The coil can be implemented by coiling one or more wires of a superconducting niobium-titanium alloy and makes it possible to subject resonator 1 to a magnetic field that can typically reach a magnetic flux density of 1 tesla. By electrically connecting the electrical signal at the output of adder 5 to the resonator, Laplace forces are induced on the beam or gate elements, according to an implementation described in Cleland, A. N., & Roukes, M. L. (1999), External control of dissipation in a nanometer-scale radiofrequency mechanical resonator, Sensors and Actuators A: Physical, 72(3), 256-261. The first transducer is adapted to transduce electromagnetic energy into mechanical energy by means of Laplace or Lorentz forces.

In other embodiments of the invention, piezoelectric, capacitive, electrostatic and/or thermoelectric transducers can be used.

Figure 3:
FIG. 3 schematically illustrates the deformation of a doubly-clamped resonator, in a cross-sectional view, during a movement caused by two excitation forces applied at two frequencies in distinct modes.

FIG. 3 schematically illustrates the deformation of a doubly-clamped resonator 1, in a cross-sectional view, during a movement caused by two excitation forces applied at very different frequencies, each corresponding to a different mode. A resonator 1 can be excited simultaneously in these different modes. These modes are independent during oscillation in a linear regime and are coupled during oscillation in a non-linear regime. According to the canonical form of the Duffing non-linearity (equation 1), it is possible to couple them dispersively in the same resonator (Westra, H. J. R., Poot, M., Van der Zant, H. S. J., & Venstra, W. J. (2010). Non-linear modal interactions in clamped-clamped mechanical resonators. Physical Review Letters, 105(11), 117205.).

The excitation of an ideal resonator at its resonance frequency causes oscillations at a given amplitude. For strong amplitudes, these oscillations exercise constraints on the material of the resonator. When the excitation amplitude increases, the resonance peak varies in frequency and modifies the form of the curve describing the amplitude as a function of frequency, from a Lorentzian curve in the linear regime to a so-called Duffing curve for higher amplitudes. This property exists for all modes of a resonator, each mode having a (non-linear) Duffing coefficient $\gamma_n$, n being the order of the mode.

If two modes are excited at sufficiently high amplitudes, similar behaviour is observed. The constraint generated by the amplitude of oscillation of a mode affects the mechanical properties of the entire resonator. The other mode is then affected and vice versa.

In FIG. 3, the resonator is excited in the fundamental mode at frequency $f_0$ with amplitude $x_0$ and in the second harmonic at frequency $f_2$ with amplitude $x_2$. The dynamic form of the resonator is defined by the two excitations, coupled by the tension terms $\delta T_0$ (proportional to $x_0^2$) and $\delta T_2$ (proportional to $x_2^2$).

Equation 1 can be solved in the following form, in the case where a single excitation force is applied:

$$x = \frac{F_L}{2m\omega_0} \frac{1}{(\omega_0 + \beta x^2 - \omega) + i\frac{\Delta\omega}{2}} \quad (2)$$

with $$\beta = \frac{3\gamma}{8\omega_0}$$

and $\gamma$ the Duffing coefficient. We use the notation $\gamma = \gamma_n$ when a single mode n is involved.

The coupling between modes is derived theoretically from beam theory (Lulla, K. J., Cousins, R. B., Venkatesan, A., Patton, M. J., Armour, A. D., Mellor, C. J., & Owers-Bradley, J. R. (2012), *Non-linear modal coupling in a high-stress doubly-clamped nanomechanical resonator*, New Journal of Physics, 14(11), 113040) by the inventors. From this, the following dispersive coupling can be deduced between the two modes:

$$\omega_n = \omega_{0,n} + \beta_n x_n^2 + \beta_{n,m} x_m^2 \quad (3)$$

where $\omega_n$ is the pulse resonance of mode n during a resonance having a Duffing curve, $\omega_{0,n}$ is the pulse resonance of mode n in the absence of coupling and comprising the Duffing term $\beta_n x_n^2$, where $$\beta_n = \frac{3\gamma_n}{8\omega_{0,n}}$$

and $x_n$ is the amplitude of mode n. The coupling with mode m is linked to the quadratic term $\beta_{n,m} x_m^2$ (where $x_m$ is the amplitude of mode m). The non-linear coefficient $\beta_{n,m}$ is given by:

$$\beta_{n,m} = \frac{1}{4\pi} \frac{E}{l^3 \sqrt{\frac{T}{\rho_{ew}}}} \times \left( \frac{\int_l \Psi_n'^2(z)dz \int_l \Psi_m'^2(z)dz}{2} + \left( \int_l \Psi_n'(z)\Psi_m'(z)dz \right)^2 \right) \quad (4)$$

where $\Psi_n'$ is the spatial derivative of the deformation of the resonator for mode n.

The origin of the coupling is visible in the term $\gamma x^3$ of equation 1 and neither of the two modes necessarily has to be in a non-linear regime.

Equation 3 makes no assumptions about the pair (n, m) and, theoretically, n can be equal to m. Therefore, a mode can theoretically be coupled with itself, which defines the technique known as self-coupling. Precisely this technique is used in all embodiments of the invention. This effect is different from the effects described previously: With self-coupling, at least two harmonic excitation signals excite a single mode n, whereas formula 1, for example, describes an effect in which one harmonic excitation signal excites a mode n.

In all embodiments of the invention, two signals are used: input signal 2 and pump signal 3, adapted to excite the same mode after addition and electromechanical transduction, at close but different angular frequencies. Equation 1 allows us to write:

$$\ddot{x} + \Delta\omega\dot{x} + \omega_0 x + \gamma x^3 = f_{L,p}\cos(\omega_p t) + f_{L,s}\cos(\omega_s t + \delta\phi) \quad (5)$$

where $f_{L,p}$ and $f_{L,s}$ are, respectively, the input signal strength, corresponding to the transduction of the component of input signal 2, and the pump strength, corresponding to the transduction of the component of pump signal 3 (normalised to the mass of the mode), bringing resonator 1 respectively to angular frequencies $\omega_s$ and $\omega_p$, with $\omega_s$ being different from $\omega_p$ and with $\delta\phi$ being the phase difference between the two signals. The electrical signal coming from adder 5 is transduced into a mechanical signal, of which $f_{L,s}$ and $f_{L,p}$ are two components. Adder 5 can be implemented by a combination of resistances and capacitances and/or of an operational amplifier, which can be monolithically integrated into a chip. For clarity of notation, we can define the following:

$$\omega_p = \omega_0 + \delta_p \quad (6)$$

$$\omega_s = \omega_p + \delta_s \quad (7)$$

where $\delta_s$ and $\delta_p$ are the scanning parameters relative to $\omega_0$. By construction, $\delta_p$ and $\delta_s$ are different than 0.

A general solution $x_0$ of equation 5 can be written in the following form:

$$x_0 = \frac{X_0 e^{i\omega_p t} + X_0^* e^{-i\omega_p t}}{2} \quad (8)$$

By replacing $$\beta = \frac{3\gamma}{8\omega_0}$$

in equation 5, we obtain:

$$\dot{X}_0 = -\left(\frac{\Delta\omega}{2} + i\delta_p\right)X_0 + i\beta X_0^2 X_0^* + \frac{1}{2i\omega_0}(f_{L,p} + f_{L,s} e^{i\delta_s t + \delta\phi}) \quad (9)$$

where $X_0$ is a slow variable ($\dot{X}_0 \ll \omega_0 X_0$), the assumption of a high quality factor is valid ($\Delta\omega \ll \omega_0$) and where we are working in a range of frequencies close to the resonance frequency $$\left(\frac{\omega_p^2 - \omega_0^2}{2\omega_p} \approx \delta_p, \frac{\beta}{\omega_p} \approx \frac{\beta}{\omega_0}\right).$$

At the first order, we can solve equation 9 with the following form of $X_0$:

$$X_0 = a_p + a_s e^{i\delta_s t} + a_i e^{-i\delta_s t} \quad (10)$$

where $a_p$, $a_s$ and $a_i$ are the complex amplitudes of the different components of the movement, characteristic of the mechanical resonance of the mode, corresponding respectively to the frequencies $\omega_p$, $\omega_p + \delta_s$ and $\omega_p - \delta_s$, where $a_p$ is the principal term principally governed by $f_{L,p}$ (the pump strength, resonating at $\omega_0 + \delta_{p,max}$), $a_s$ principally governed by $f_{L,s}$ (the input signal strength, resonating at $\omega_p + \delta_{s,max}$) and $a_i$, the image of $a_s$ symmetrically to $a_p$ (the complementary signal, resonating at $\omega_p + \delta_{i,max}$).

Figure 4:
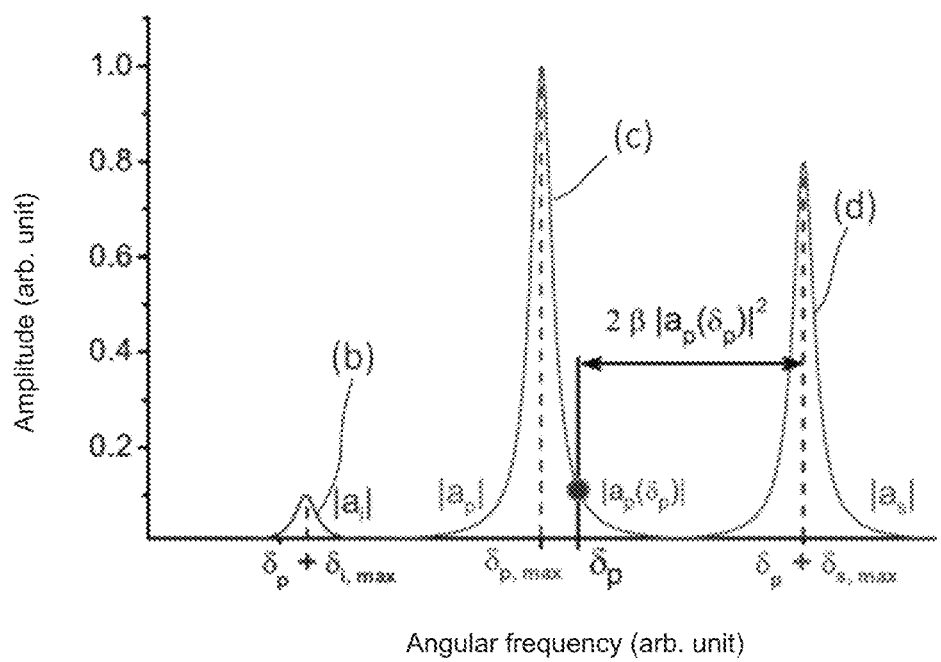
FIG. 4 schematically illustrates resonances close to the natural angular frequency of a mechanical mode of the resonator.

FIG. 4 schematically illustrates the resonances close to the angular frequency $\delta_{p,max}$ (reduced bifurcation angular frequency) translated by $\omega_0$. By inserting the terms of equation 10 into equation 9 and using a rotating wave approximation, we obtain the following system of equations for the different components of the angular frequencies relative to $\omega_p$:

$$e^{i0}: a_p = \frac{f_{L,p}}{2\omega_0} \frac{1}{\beta|a_p|^2 - \delta_p + i\frac{\Delta\omega}{2}} \quad (11)$$

$$e^{i\delta_s t}: a_s = \frac{\frac{f_{L,s} e^{i\delta\phi}}{2\omega_0} - \beta a_p^2 a_i^*}{2\beta|a_p|^2 - \delta_p - \delta_s + i\frac{\Delta\omega}{2}} \quad (12)$$

$$e^{-i\delta_s t}: a_i = \frac{-\beta a_p^2 a_s^*}{2\beta|a_p|^2 - \delta_p + \delta_s + i\frac{\Delta\omega}{2}} \quad (13)$$

By isolating each of the variables and expressing them as functions of $a_p$, we finally obtain:

$$a_p = \frac{f_{L,p}}{2\omega_0} \frac{1}{\beta|a_p|^2 - \delta_p + i\frac{\Delta\omega}{2}} \quad (14)$$

$$a_s = \frac{f_{L,s} e^{i\delta\phi}}{2\omega_0} \frac{1}{2\beta|a_p|^2 - \delta_p - \delta_s + i\frac{\Delta\omega}{2} - \frac{\beta^2|a_p|^4}{2\beta|a_p|^2 - \delta_p + \delta_s - i\frac{\Delta\omega}{2}}} \quad (15)$$

$$a_i = \frac{f_{L,s} e^{-i\delta\phi}}{2\omega_0} \frac{1}{2\beta|a_p|^2 - \delta_p + \delta_s + i\frac{\Delta\omega}{2} - \frac{\beta^2|a_p|^4}{2\beta|a_p|^2 - \delta_p - \delta_s - i\frac{\Delta\omega}{2}}} \times \frac{\beta a_p^2}{2\beta|a_p|^2 - \delta_p - \delta_s - i\frac{\Delta\omega}{2}}. \quad (16)$$

We now observe that equation 14 is similar to equation 2 with $\delta_p = \omega_p - \omega_0$ being the scanning parameter for the component $a_p$. The resonance to the angular frequency $\omega_p$ is a Duffing resonance. Note that equation 14 is non-linear with respect to $a_p$, while equation 15 is linear with respect to $a_s$, and that equation 16 is linear with respect to $a_i$. According to one embodiment of the invention, we can actuate resonator 1 by adding input signal 2 and pump signal 3, for example by means of adder 5, and transduce the resulting electrical signal to resonator 1 in the form of a mechanical signal, including the components $f_{L,s}$ and $f_{L,p}$. At least one of the amplitudes of the signals at the input of adder 5 (input signal 2 and/or pump signal 3) has an amplitude sufficient to actuate resonator 1 in a non-linear regime and, in particular, in a Duffing regime, at least in a first range of angular frequencies close to $\omega_0$. Typically, it is pump signal 3 that has this amplitude. In all embodiments of the invention, the amplitude of the oscillations of the resonator is linear in a second range of angular frequencies close to $\omega_p$, in a range including the resonance of the signal $a_s$ and/or $a_i$. In particular, the curve of the amplitude of the oscillations as a function of the second range of angular frequencies can be Lorentzian.

Preferentially, the difference $\delta_s$ defined by $\omega_s - \omega_p$ is at least fifty times smaller than $\omega_0$, the difference $\delta_p$ defined by $\omega_p - \omega_0$ is at least fifty times smaller than $\omega_0$ and $\omega_p$ is different from $\omega_s$.

According to one embodiment of the invention, the amplitude of the oscillation of resonator 1 is measured in a second range of frequencies close to $\omega_p$, for example in a range including the resonance of the signal $a_s$.

The normal of the different components $a_p$, $a_s$ and $a_i$ is illustrated in FIG. 4 as a function of an angular frequency relative to $\delta_{p,max}$, by curves (b), (c) and (d), respectively. The principal term corresponding to $|a_p|$ is centered in angular frequency on $\delta_{p,max}$, a term corresponding to $|a_s|$ is centered on $\delta_p + \delta_{s,max}$ and a third term corresponding to $|a_i|$ is centered on $\delta_p + \delta_{i,max}$. In a preferred embodiment of the invention, actuating resonator 1 causes an amplitude of the oscillations of resonator 1 that varies linearly with input signal 2 substantially at the angular frequency $\omega_p + \delta_s$. In a preferred embodiment of the invention, an amplitude of the oscillation of mechanical resonator 1, called the output amplitude, is measured, substantially at the angular frequency $\omega_p + \delta_s$. In different embodiments of the invention, one can measure the amplitude of the resonator by measuring a capacitive variation and/or by measuring a deviation of an optical signal. In one embodiment of the invention, a number of amplitudes of the resonator can be measured, in a range of angular frequencies close to $\omega_p+\delta_s$. A bandpass filter 4 with a high quality factor can preferentially be used, having a bandwidth centered on an angular frequency close to $\omega_0$ and preferentially substantially equal to $\omega_p+\delta_s$. In particular embodiments of the invention, such a filter can be manufactured in an integrated manner on a chip. A bandpass filter 4 can be implemented with a combination, known to the person skilled in the art, of resistances and capacitances and/or of active components, e.g. of operational amplifiers and/or a synchronous detection.

Figure 5:
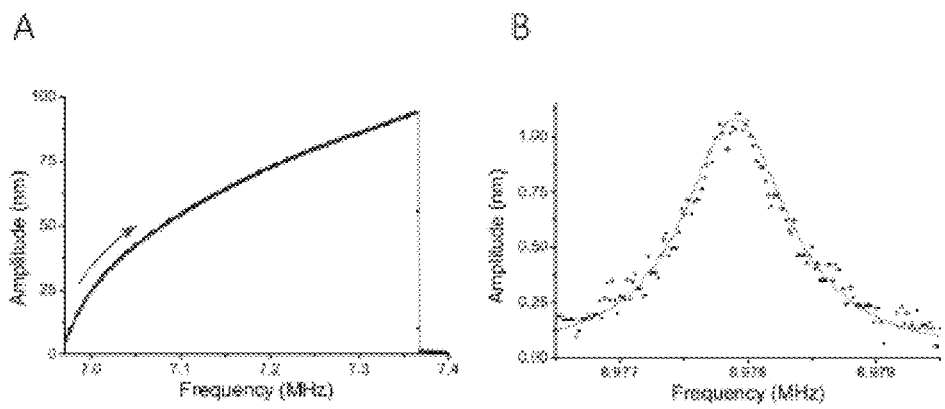
FIG. 5 illustrates amplitudes of a resonator measured as a function of the oscillation frequency, in the case of excitation of the resonator by the pump signal alone and in the case of excitation by the input signal alone.

FIG. 5 illustrates amplitudes of resonator 1 measured in the case of excitation of resonator 1 by pump signal 3 alone (panel A) and in the case of excitation by input signal 2 alone (panel B). In panels A and B of FIG. 5, we have $f_{L,s} \ll f_{L,p}$ and more specifically m $f_{L,p}$=100 m $f_{L,s}$=6,4 pN (m being the mass of the mode). The driving force related to pump signal 3 excites resonator 1 with a non-linear dynamic, illustrated in panel A, while the driving force related to input signal 2 excites resonator 1 linearly. The amplitude ratio between the maximum amplitude measured in panel A and in panel B is not exactly 100 due to non-linear effects in the dissipative component $\Delta\omega$ specific to the material of resonator 1.

In the case where the forces $f_{L,s}$ and $f_{L,p}$ illustrated in FIG. 5 are generated simultaneously and self-coupled by resonator 1, we can rewrite equation 15 without ignoring the non-linear terms in $a_p$ while ignoring the non-linear terms in $a_s$. By redistributing the fourth-order term in the denominator, we obtain the following equation:

$$a_s = \frac{f_{L,s} e^{i\delta\phi}}{2\omega_0} \times \frac{1}{2\beta|a_p|^2(1-|A_0|^2) - \delta_p(1-|A_0|^2) - \delta_s(1+|A_0|^2) + i\frac{\Delta\omega}{2}(1-|A_0|^2)} \quad (17)$$

where:

$$A_0 = \frac{\beta|a_p|^2}{2\beta|a_p|^2 - \delta_p + \delta_s + i\frac{\Delta\omega}{2}} \quad (18)$$

which allows us to obtain:

$$a_s = \frac{f_{L,s} e^{i\delta\phi}}{2\omega_0} \frac{1}{1-|A_0|^2} \frac{1}{2\beta|a_p|^2 - \delta_p - \delta_s\left(\frac{1+|A_0|^2}{1-|A_0|^2}\right) + i\frac{\Delta\omega}{2}} \quad (19)$$

Equation 19 is equivalent to equation 15 for $A_0 \approx 0$. The pump amplitude $a_p$ can be controlled in embodiments of the invention via two parameters: the reduced force $f_{L,p}$ and the angular frequency of excitation $\omega_p$ (or in reduced units $\delta_p$). For an excitation force related to the given pump signal 3, the amplitude $a_p$ can be maximised by approaching $\delta_p$ as close as possible to the maximum amplitude of the Duffing resonance, by always choosing the maximum amplitude branch during a bistable resonance of resonator 1.

Two characteristics emerge from equation 19. First, to find the resonance frequency of $a_s$, we must set the real part of the denominator of equation 19 to zero. The scanning parameter for $a_s$ being $\delta_s$, this condition is valid for:

$$\delta_s^3 + \delta_s^2(2\beta|a_p|^2 - \delta_p) - \delta_s\left[(3\beta|a_p|^2 - \delta_p)(\beta|a_p|^2 - \delta_p) - \left(\frac{\Delta\omega}{2}\right)^2\right] - \quad (20)$$

-continued $$(2\beta|a_p|^2 - \delta_p)\left[(3\beta|a_p|^2 - \delta_p)(\beta|a_p|^2 - \delta_p) + \left(\frac{\Delta\omega}{2}\right)^2\right] = 0$$

where $|A_0|^2$ is developed according to equation 18. By solving the third-order polynomial in $\delta_s$, we find a single valid solution corresponding to $\delta_{s,max}$.

Second, the prefactor of equation 17 implies that the amplitude of $|a_s|$ is modified by $|a_p|$. The coupling effect between the excitations caused by input signal 2 and pump signal 3 is not only a shifting of the frequency but also an amplification. We can write the associated gain factor G by comparing the amplitude of $|a_s|$ in resonance with and without the additional component $f_{L,p}$ (case of an input signal 2 alone, called "standard", in the numerator of equation 21, and case of an input signal 2 added to a pump signal 3, called "pumped", in the denominator of equation 21):

$$G = \frac{|a_{s,standard}|}{|a_{s,pumped}|} = \frac{1}{1-|A_0|^2} \quad (21)$$

In this embodiment, self-coupling is used to amplify input signal 2 by a pump signal 3 of a larger amplitude: this is the definition of the self-pumping technique. The output signal of resonator 1 is an input signal 2, amplified and of a substantially different resonance frequency, shifted and with no non-linearity.

Figure 6:
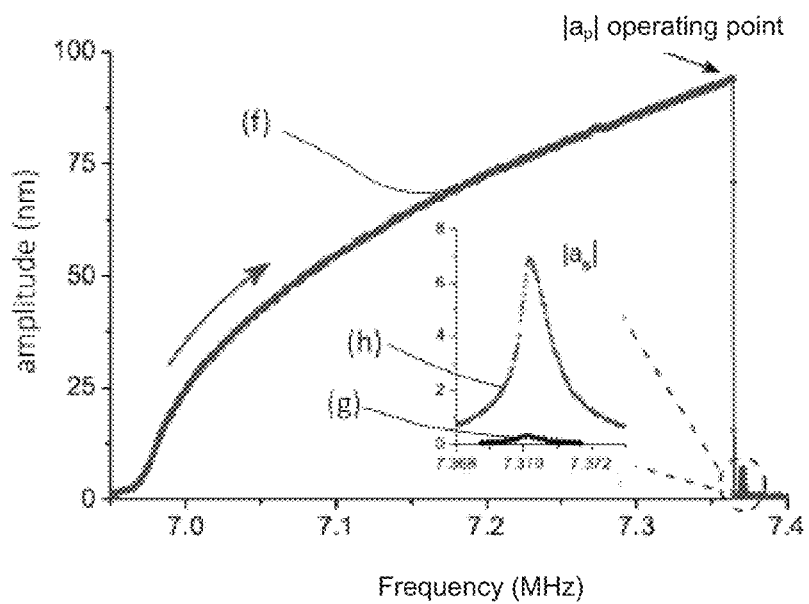
FIG. 6 illustrates the amplitude of a resonator as a function of the oscillation frequency, the resonator being actuated according to one embodiment of the invention.

FIG. 6 illustrates the amplitude of the resonator as a function of the oscillation frequency, the resonator being actuated according to one embodiment of the invention. Input signal 2 of angular frequency $\omega_s$ close to $\omega_0$ is added to pump signal 3 of angular frequency $\omega_s$ close to $\omega_0$ and different from $\omega_p$. The signal resulting from the addition of input signal 2 and pump signal 3 is transduced to the mechanical resonator. In this embodiment, the amplitude of the output oscillation, i.e. of resonator 1, is measured. This measurement can be achieved optically, electromagnetically or electrostatically. Curve (f) illustrates the absolute value of $a_p$. The black arrow at the top right of the figure indicates the frequency $\omega_p$ used as the operating point of pump signal 3 to inject input signal 2 (illustrated by curve (g), the frequency of which is shifted to allow for a visible comparison in FIG. 6). Curve (h) illustrates the resonance line corresponding to $|a_s|$. This resonance line is centered on $\omega_p+\delta_{s,max}$. More generally, this resonance line is centered on an angular frequency close to $\omega_p$. The gain factor of equation 21 is equal in this embodiment to 20, which equates to an amplification of 26 dB. The shape of curve (h) is Lorentzian and has width (or dissipation) $\Delta\omega$. In this embodiment of the invention, the effective dissipation related to the component $|a_s|$ is substantially equal to the effective dissipation measured when the resonator is actuated with input signal 2 alone and the amplitude $|a_s|$ is substantially higher.

Preferentially, for the amplification, we choose $\delta_s > 0$ if $\gamma$ (i.e. $\gamma_n$ in this case) is strictly greater than 0. Indeed, we are no longer in the self-pumping regime in the case where $\delta_s = 0$ ($\omega_s = \omega_p$). In this case, the resonator is actuated at frequency $\omega_s$ with a strength equal to $f_{L,s}+f_{L,p}$. This particular case of excitation can cause a transition of $a_p$ changing from high amplitudes to low amplitudes. The probability of such a relaxation event increases as we approach the reduced bifurcation angular frequency $\delta_{p,max}$ of $a_p$ and causes a practical limitation on the maximum gain that can be achieved by this method, if all other parameters are kept constant. This limitation on the gain can be compensated by an increase in the amplitude of pump signal 3, for example.

Figure 7:
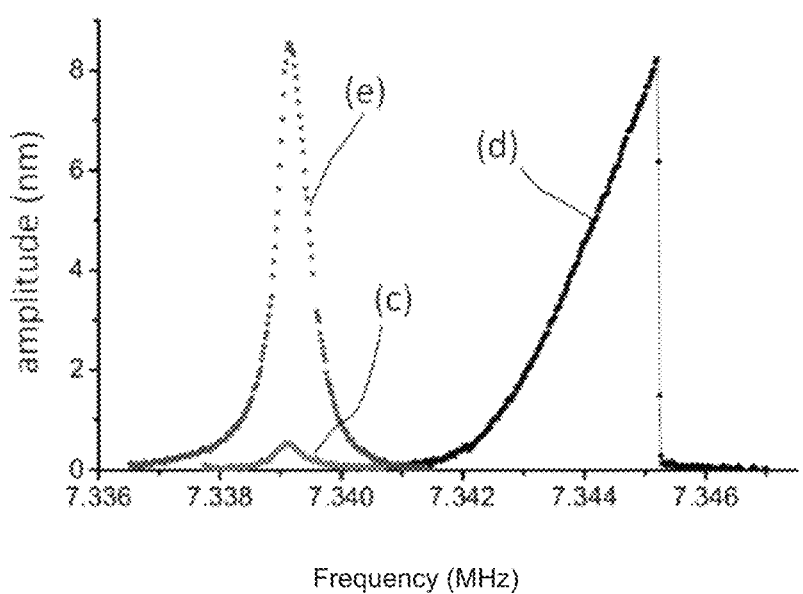
FIG. 7 illustrates a linear amplification according to one embodiment of the invention.

FIG. 7 illustrates a linear amplification according to one embodiment of the invention. In the embodiments described previously, the signal $a_s$ is considered as linear because the excitation $f_{L,s}$ is very small. In a particular embodiment of the invention, the increase in the amplitude of $a_s$ by amplification may correspond to amplitudes for which the resonator oscillates, outside of the self-pumping regime, non-linearly and in particular according to a Duffing equation. We can analytically express the expressions of $a_p$, $a_s$ and $a_i$ by differentiating the lowest-order non-linear term in equations 11, 12 and 13 with respect to $a_s$, introducing the standard Duffing expression. We obtain:

$$e^{i0}: a_p = \frac{f_{L,p}}{2\omega_0} \frac{1}{\beta(|a_p|^2 + 2|a_s|^2 + 2|a_i|^2 + 2a_s a_i e^{i\phi_p}) - \delta_p + i\frac{\Delta\omega}{2}} \quad (22)$$

$$e^{i\delta_s}: a_s = \frac{\frac{f_{L,s}e^{i\delta\phi}}{2\omega_0} - \beta a_p^2 a_i^*}{\beta(2|a_p|^2 + |a_s|^2 + 2|a_i|^2) - \delta_p - \delta_s + i\frac{\Delta\omega}{2}} \quad (23)$$

$$e^{-i\delta_s}: a_i = \frac{-\beta a_p^2 a_s^*}{\beta(2|a_p|^2 + 2|a_s|^2 + |a_i|^2) - \delta_p + \delta_s + i\frac{\Delta\omega}{2}} \quad (24)$$

where $\phi_p$ is defined by $a_p^* = a_p e^{i\Phi_p}$. In this case, equations 22, 23 and 24 are coupled with each other. With the notations used previously, we have:

$$a_p = \frac{f_{L,p}}{2\omega_0} \frac{1}{\beta[|a_p|^2 + 2|a_s|^2(1 + |A|^2 - A)] - \delta_p + i\frac{\Delta\omega}{2}} \quad (25)$$

$$a_s = \frac{f_{L,s}e^{i\delta\phi}}{2\omega_0} \frac{1}{1 - |A|^2} \times \frac{1}{\frac{1 + |A|^2}{1 - |A|^2}(\beta|a_s|^2(1 - |A|^2) - \delta) + 2\beta|a_p|^2 - \delta_p + i\frac{\Delta\omega}{2}} \quad (26)$$

$$a_i = -Ae^{-i\phi_p}a_s^* \quad (27)$$

where:

$$A = \frac{\beta|a_p|^2}{\beta[2|a_p|^2 + |a_s|^2(2 + |A|^2)] - \delta_p + \delta_s + i\frac{\Delta\omega}{2}} \quad (28)$$

The inventors have discovered that under these conditions, the non-linear dependency of the variables as a function of other variables is reduced or even goes to zero experimentally, in particular with regard to the non-linear dependencies of $a_s$. FIG. 7 illustrates a linear amplification under these conditions. Curve (e) of FIG. 7 corresponds to the resonance line of $|a_s|$, under high-amplitude pumping conditions and resulting in a large amplitude of $|a_p|$. In this embodiment, $|a_p|$ can be less than or equal to 90 nm and/or greater than or equal to the thickness of the layers of resonator 1. The inventors have also discovered that the behaviour of $|a_s|$ is linear. By way of comparison, curve (d) of FIG. 7 (the frequency of which is shifted in order to make the figure clearer) illustrates a simple excitation of resonator 1, the strength of which is adapted to reach the same amplitude as $|a_s|$: the resonance line of curve (d) corresponds to an oscillator behaviour in a Duffing regime. In this embodiment, the linear dynamic of the system is amplified by a factor of 5.

These results illustrate the ability of this embodiment, in the self-pumping regime, to amplify the amplitude of the signal while increasing the linear dynamic range of the system. The increase in this linear dynamic range can be directly applied to detection systems, for example.

The embodiments of linear actuation and/or linear amplification described have the advantage of not resorting to an electromechanical adjustment performed by a capacitive grid that makes it possible to compensate the non-linearities as described in the prior art. These embodiments are compatible with a simultaneous adjustment of the resonance frequency induced by a polarised grid. In particular, in one embodiment of the invention, the frequency of the mode can be adjusted by polarisation of an electrode coupled to resonator 1.

Figure 8:
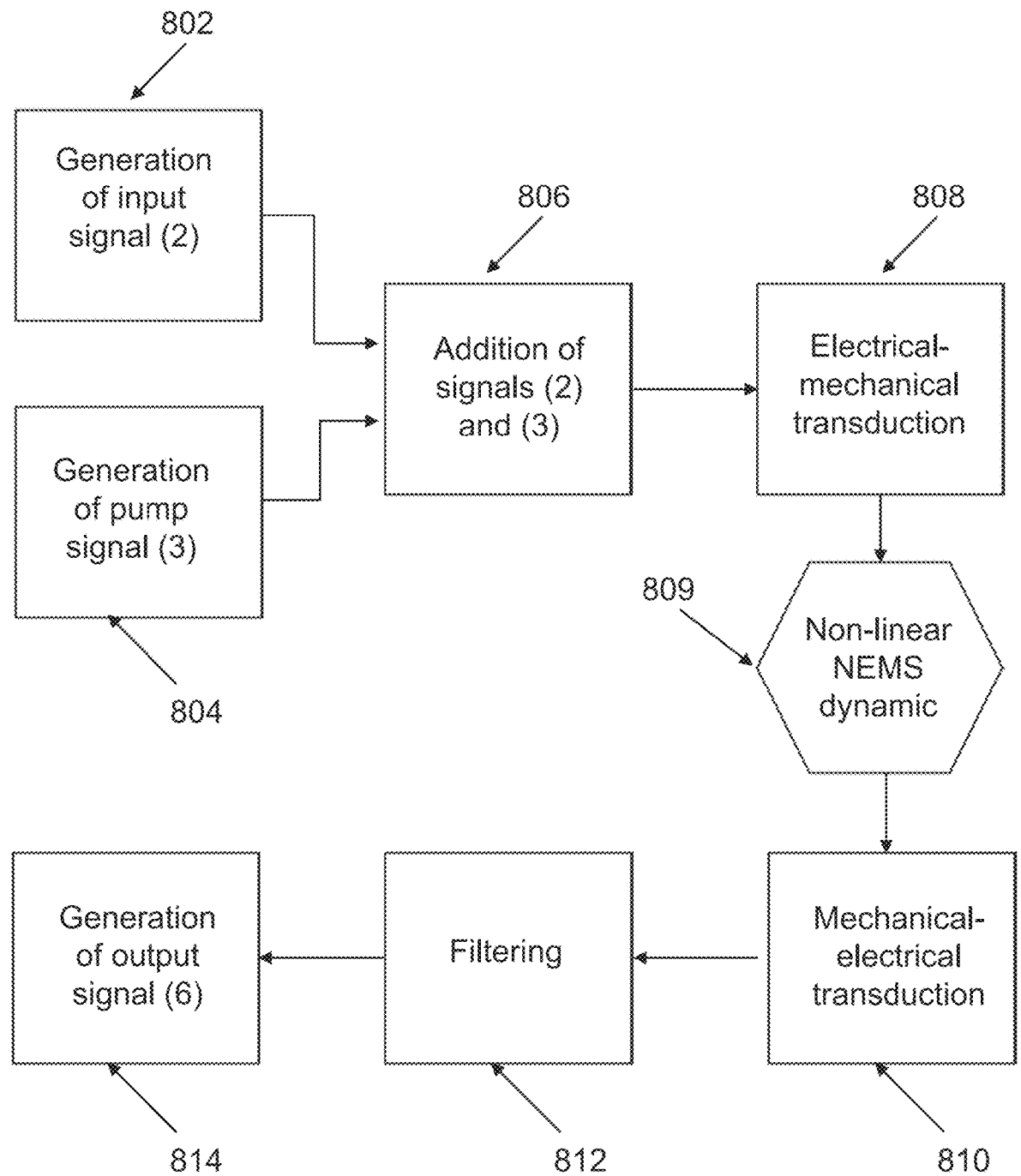
FIG. 8 illustrates the steps of the electromechanical amplifying method of the invention according to one embodiment of the invention.

FIG. 8 illustrates the steps of the electromechanical amplifying method of the invention according to one embodiment applied to a mechanical resonator 1 of angular frequency $\omega_0$. In general, the method consists of generating (802) a first input signal 2 of first amplitude and first angular frequency $\omega_s$ and generating (804) a second pump signal 3 of second angular frequency $\omega_p$ different from the first angular frequency. In a preferred embodiment, the angular frequencies of the two input and pump signals are close to the angular frequency $\omega_0$ of the mechanical resonator. Advantageously, pump signal 3 is chosen in a range of angular frequencies $\omega_p$ and amplitudes at which the resonator is actuated in a non-linear regime.

In one embodiment, the difference $\delta_s$ between the first and second angular frequencies, defined by "$\omega_s-\omega_p$", is at least fifty times smaller than the angular frequency $\omega_0$ of the resonator and the difference $\delta_p$ between the second angular frequency and the angular frequency $\omega_0$ of the resonator, defined by "$\omega_p-\omega_0$", is at least fifty times smaller than the angular frequency $\omega_0$ of the resonator.

The two input and pump signals are then added (step 806). In a subsequent step (808), the resulting electrical signal is transduced to the mechanical resonator (1), which actuates (809) non-linear oscillations of the resonator.

In one embodiment, the non-linear oscillations of the resonator follow a non-linear Duffing differential equation and the Duffing coefficient is non-zero.

In a subsequent step (810), the method allows for the non-linear oscillations of the resonator to be transduced into an electrical signal, which is filtered (812) to obtain an output signal (6). Advantageously, the amplitude of the oscillations after filtering is measured substantially at the angular frequency "$\omega_p+\delta_s$".

Preferentially, the filtering step is performed with a band-pass filter of which the bandwidth is centered on an angular frequency close to the angular frequency $\omega_0$ of the mechanical resonator. In a variant, the bandwidth of the filter is centered on an angular frequency substantially equal to $\omega_p+\delta_s$.

The implementation of the method makes it possible to generate an output signal 6, which is amplified, the amplitude of the oscillations measured after the filtering step varying linearly with the first input signal 2 of angular frequency $\omega_s$ and the resonant mode obtained being that of a linear resonance.

The invention claimed is:

1. An electromechanical amplifying method comprising at least:
a first transducing step of transducing an electrical signal to a mechanical resonator having a mechanical resonance mode of angular frequency $\omega_0$, said electrical signal actuating non-linear oscillations of the resonator;
a second transducing step of transducing the non-linear oscillations of the resonator into a transduced electrical signal; and
a filtering step of filtering said transduced electrical signal to obtain an output signal, wherein,
the signal transduced to the resonator is obtained by adding a first input signal of a first amplitude and of a first angular frequency $\omega_s$ and a pump signal of a second amplitude greater than the first amplitude and of a second angular frequency $\omega_p$ that is different from the first angular frequency, the first and second angular frequencies being close to the angular frequency $\omega_0$ of the mechanical resonator and the second pump signal being chosen from a range of angular frequencies $\omega_p$ and amplitudes in which the resonator is actuated in a non-linear regime; and
the output signal is amplified, the amplitude of the oscillations measured after the filtering varying linearly with the first input signal of the angular frequency $\omega_s$ and the resonant mode obtained is that of a linear resonance.

2. The method according to claim 1 in which the electrical signal transduced to the resonator actuates non-linear oscillations of the resonator following a non-linear differential equation.

3. The method according to claim 2 in which the non-linear differential equation is a Duffing equation.

4. The method according to claim 3 in which the Duffing coefficient is non-zero.

5. The method according to claim 1, wherein the difference $\delta_s$ between the first and second angular frequencies, defined by "$\omega_s-\omega_p$" is at least fifty times smaller than the angular frequency $\omega_0$ of the resonator and the difference $\delta_p$ between the second angular frequency and the angular frequency $\omega_0$ of the resonator, defined by "$\omega_p-\omega_0$", is at least fifty times smaller than the angular frequency $\omega_0$ of the resonator.

6. The method according to claim 5 in which the amplitude of the oscillations after filtering is measured substantially at the angular frequency "$\omega_p+\delta_s$".

7. The method according to claim 1, wherein the filtering step is performed with a bandpass filter of which the bandwidth is centered on an angular frequency close to the angular frequency $\omega_0$ of the mechanical resonator.

8. The method according to claim 7 in which the bandwidth of the filter is centered on an angular frequency substantially equal to $\omega_p+\delta_s$.

9. An electromechanical amplification device comprising at least one mechanical resonator having a mechanical resonance mode of angular frequency $\omega_0$, the device also comprising:
an electrical signal adder, able to add a first input signal of a first amplitude and a first angular frequency $\omega_s$ and a pump signal of a second amplitude greater than the first amplitude and of a second angular frequency $\omega_p$ that is different from the first angular frequency, the first and second angular frequencies being close to the angular frequency $\omega_0$ of the mechanical resonator, the pump signal being chosen from a range of angular frequencies $\omega_p$ and amplitudes in which the resonator is actuated in a non-linear regime;
a first electromechanical transducer connected on one hand electrically to the output of the adder and on the other hand mechanically to the mechanical resonator, the first transducer being adapted to transduce the electrical signal at the output of the adder to the mechanical resonator in order to actuate non-linear oscillations of the resonator;
a second electromechanical transducer connected on one hand mechanically to the mechanical resonator and on the other hand electrically to a filter, the second transducer being adapted to transduce the non-linear oscillations of the resonator into a transduced electrical signal; and
an electrical signal filter able to filter the transduced electrical signal to obtain an output signal, the output signal being amplified, the amplitude of the oscillations measured at the output of the filter varying linearly with the first input signal of angular frequency $\omega_s$ and the resonant mode obtained is that of a linear resonance.

10. The device according to claim 9 in which the mechanical resonator is chosen at least between a microsystem and a nanosystem.

11. The device according to claim 9, wherein the bandwidth of the filter is centered on an angular frequency close to the angular frequency $\omega_0$ of the mechanical resonator.

12. The device according to claim 9, wherein at least two elements chosen among said adder, said filter, said first mechanical transducer and said second electromechanical transducer are monolithically integrated.

13. The device according to claim 9, further comprising an electric generator to generate the pump signal.

14. The device according to claim 13 in which at least one transducer chosen between the first transducer and the second transducer is adapted to transduce energy by means of the work done by Laplace forces or Lorentz forces.

15. The device according to claim 9, wherein at least one transducer chosen between the first transducer and the second transducer are adapted to transduce energy by an effect chosen among at least one piezoelectric and piezoresistive effect.

16. The method according to claim 2, wherein the difference $\delta_s$ between the first and second angular frequencies, defined by "$\omega_s-\omega_p$" is at least fifty times smaller than the angular frequency $\omega_0$ of the resonator and the difference $\delta_p$ between the second angular frequency and the angular frequency $\omega_0$ of the resonator, defined by "$\omega_p-\omega_0$", is at least fifty times smaller than the angular frequency $\omega_0$ of the resonator.

17. The method according to claim 3, wherein the difference $\delta_s$ between the first and second angular frequencies, defined by "$\omega_s-\omega_p$" is at least fifty times smaller than the angular frequency $\omega_0$ of the resonator and the difference $\delta_p$ between the second angular frequency and the angular frequency $\omega_0$ of the resonator, defined by "$\omega_p-\omega_0$", is at least fifty times smaller than the angular frequency $\omega_0$ of the resonator.

18. The method according to claim 4, wherein the difference $\delta_s$ between the first and second angular frequencies, defined by "$\omega_s-\omega_p$" is at least fifty times smaller than the angular frequency $\omega_0$ of the resonator and the difference $\delta_p$ between the second angular frequency and the angular frequency $\omega_0$ of the resonator, defined by "$\omega_p-\omega_0$", is at least fifty times smaller than the angular frequency $\omega_0$ of the resonator.

19. The method according to claim 6, wherein the filtering step is performed with a bandpass filter of which the bandwidth is centered on an angular frequency close to the angular frequency $\omega_0$ of the mechanical resonator.

20. The device according to claim 10, wherein the bandwidth of the filter is centered on an angular frequency close to the angular frequency $\omega_0$ of the mechanical resonator.

* * * * *